United States Patent
Liu et al.

(10) Patent No.: US 10,504,594 B1
(45) Date of Patent: Dec. 10, 2019

(54) NON-VOLATILE MEMORY AND FORMING METHOD THEREOF

(71) Applicant: UNITED MICROELECTRONICS CORP., Hsin-Chu (TW)

(72) Inventors: Ai-Sen Liu, Hsinchu (TW); Bin-Siang Tsai, Changhua County (TW); Chin-Fu Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/170,061

(22) Filed: Oct. 25, 2018

(30) Foreign Application Priority Data

Sep. 18, 2018 (CN) .......................... 2018 1 1085070

(51) Int. Cl.
*G11C 16/04* (2006.01)
*G11C 13/02* (2006.01)
*H01L 27/02* (2006.01)

(52) U.S. Cl.
CPC ........ *G11C 13/025* (2013.01); *H01L 27/0251* (2013.01)

(58) Field of Classification Search
CPC .......................... G11C 13/025; H01L 27/0251
USPC ..................................... 365/185.03
See application file for complete search history.

(56) References Cited

U.S. PATENT DOCUMENTS

| | | | |
|---|---|---|---|
| 7,113,426 B2 | 9/2006 | Rueckes | |
| 8,456,902 B2 * | 6/2013 | Kioussis | G11C 11/14 365/157 |
| 2008/0233744 A1 | 9/2008 | Kaul | |
| 2010/0147657 A1 | 6/2010 | Sen | |
| 2012/0196074 A1 * | 8/2012 | Ago | B82Y 30/00 428/64.1 |
| 2013/0223166 A1 * | 8/2013 | Schuette | G11C 7/00 365/189.16 |

* cited by examiner

*Primary Examiner* — Vu A Le
(74) *Attorney, Agent, or Firm* — Winston Hsu

(57) ABSTRACT

A non-volatile memory includes a back gate, a first graphene ribbon layer, a dielectric layer, a second graphene ribbon layer and a porous dielectric layer. The back gate is disposed in a substrate. The first graphene ribbon layer is disposed on the substrate. The dielectric layer covers the first graphene ribbon layer but exposes an exposed part of the first graphene ribbon layer. The second graphene ribbon layer including two end parts connected by a cantilever part is disposed above the first graphene ribbon layer, and the cantilever part is right above the exposed part of the first graphene ribbon layer. The porous dielectric layer is disposed on the dielectric layer and seals the cantilever part. The present invention also provides a method of forming said non-volatile memory.

20 Claims, 5 Drawing Sheets

NON-VOLATILE MEMORY AND FORMING METHOD THEREOF

BACKGROUND OF THE INVENTION

1. Field of the Invention

The present invention relates generally to a non-volatile memory and forming method thereof, and more specifically to a non-volatile memory applying graphene and forming method thereof.

2. Description of the Prior Art

Various microprocessor systems that are able to handle data and arrange information have become an important foundation of information development in the highly developed modern information society. A memory used to store digital data and to provide stored data for microprocessor systems is one of the most important structures in each kind of microprocessor system. A flash memory or an EEPROM (electrically erasable programmable read only memory), due to electron operation, is able to store data in a non-volatile way and to read the stored data quickly and efficiently, unlike optical or magnetic storage media (such as a disc or an optical disc) cooperating with machines so as to access data. Therefore, the flash memory with light volume and convenient and efficient operation has been utilized widely in various microprocessor systems, such as application chip systems, mobile phones, personal digital assistants, personal computers, digital cameras, etc.

SUMMARY OF THE INVENTION

The present invention relates generally to a non-volatile memory and forming method thereof, which grows graphene on an insulating layer to form the non-volatile memory, thereby simplifying processes, improving the stability of structures, and enhancing processing yields.

The present invention provides a non-volatile memory including a back gate, a first graphene ribbon layer, a dielectric layer, a second graphene ribbon layer and a porous dielectric layer. The back gate is disposed in a substrate. The first graphene ribbon layer is disposed on the substrate. The dielectric layer covers the first graphene ribbon layer but exposes a part of the first graphene ribbon layer. The second graphene ribbon layer is disposed above the first graphene ribbon layer, wherein the second graphene ribbon layer includes a cantilever part connecting two end parts, and the cantilever part is located right above the part exposed by the first graphene ribbon layer. The porous dielectric layer is disposed on the dielectric layer and seals the cantilever part.

The present invention provides a method of forming a non-volatile memory including the following steps. A first graphene ribbon layer, a first dielectric layer, a second graphene ribbon layer, a second dielectric layer and a porous dielectric layer are sequentially formed on a substrate. A hard mask layer is formed to cover the porous dielectric layer but expose a part of the porous dielectric layer. A treatment process is performed to remove a part of the second dielectric layer and a part of the first dielectric layer right below the exposed part of the porous dielectric layer, thereby a cantilever part of the second graphene ribbon layer being formed from the part of the second graphene ribbon layer right below the exposed part of the porous dielectric layer.

According to the above, the present invention relates generally to a non-volatile memory and forming method thereof, which includes a first graphene ribbon layer disposed on a substrate; a dielectric layer covers the first graphene ribbon layer but exposes a part of the first graphene ribbon layer; a second graphene ribbon layer disposed above the first graphene ribbon layer, wherein the second graphene ribbon layer includes a cantilever part connecting two end parts, and the cantilever part is located right above the exposed part of the first graphene ribbon layer. In this way, logic "0" or logic "1" can be obtained by applying a voltage to change the bending curvature of the cantilever part. Compared to non-volatile memory devices formed by nanotubes, graphene ribbon layers of the present invention are easier to grow on insulating layers such as oxide layers, thereby simplifying processes and improving structures, and hence improving processing yields.

The present invention also provides a method of forming a non-volatile memory, which forms a first graphene ribbon layer, a first dielectric layer, a second graphene ribbon layer, a second dielectric layer and a porous dielectric layer sequentially on a substrate; forms a hard mask layer covering the porous dielectric layer but exposing a part of the porous dielectric layer; performs a treatment process to remove a part of the second dielectric layer and a part of the first dielectric layer right below the exposed part of the porous dielectric layer, thereby forming a cantilever part of the second graphene ribbon layer formed from the part of the second graphene ribbon layer right below the exposed part of the porous dielectric layer. By doing this, the first dielectric layer and the second dielectric layer can be partially removed by the treatment process of the present invention, and the cantilever part of the second graphene ribbon layer can be formed. This simplifies processes, and no electrostatic stiction occurs caused by electrostatic charge accumulation, thus data error caused by electrostatic stiction occurring while reading or writing can being avoided. Smaller gaps between the graphene ribbon layers and low deformations of the graphene ribbon layers lead to the non-volatile memory having high reading/writing speed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
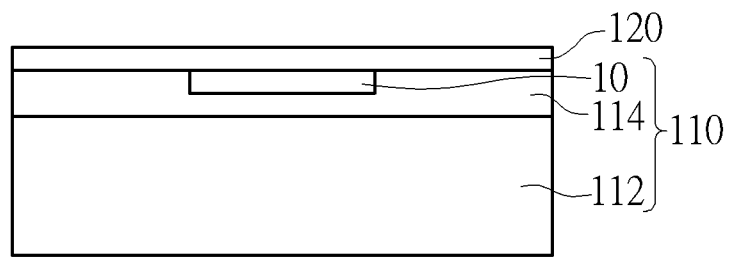
FIG. 1 schematically depicts a cross-sectional view of a method of forming a non-volatile memory according to an embodiment of the present invention.
Figure 8:
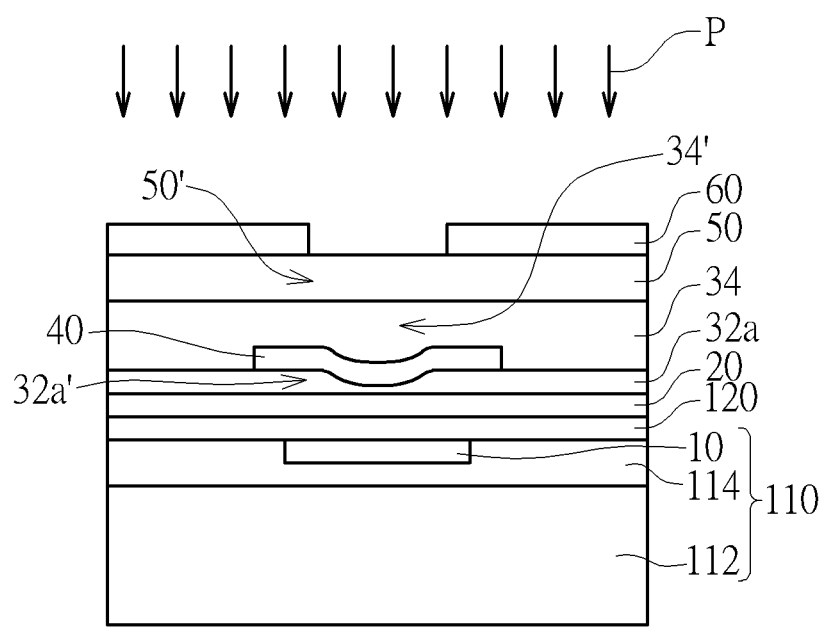
FIG. 8 schematically depicts a cross-sectional view of a method of forming a non-volatile memory according to an embodiment of the present invention.
Figure 9:
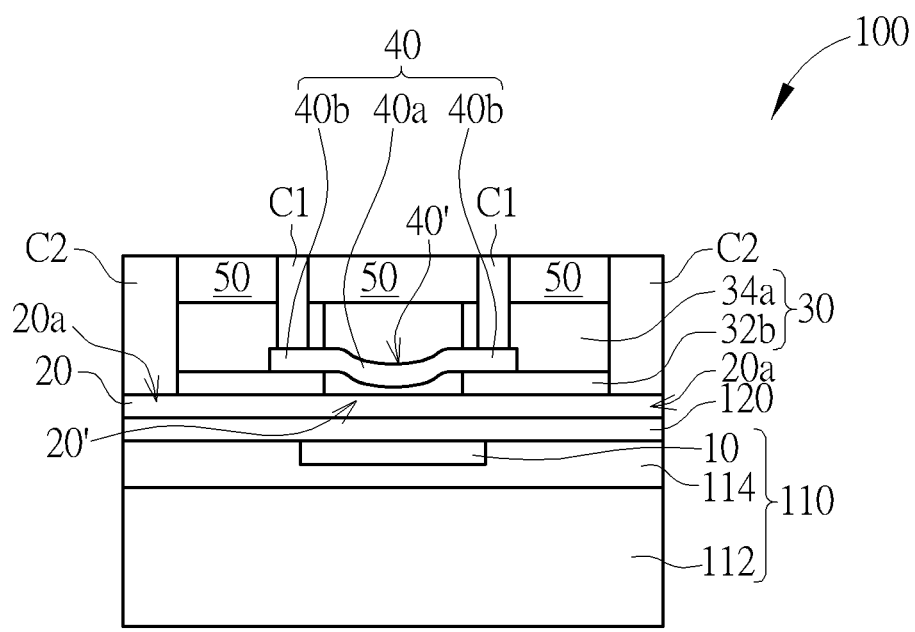
FIG. 9 schematically depicts a cross-sectional view of a method of forming a non-volatile memory according to an embodiment of the present invention.
Figure 10:
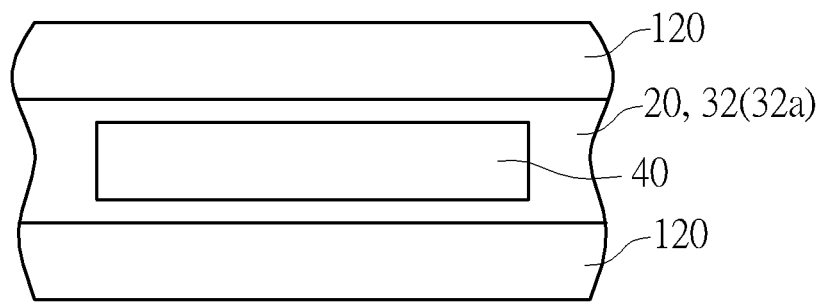
FIG. 10 schematically depicts a top view of a method of forming a non-volatile memory according to an embodiment of the present invention.

FIGS. 1-9 schematically depict cross-sectional views of a method of forming a non-volatile memory according to an embodiment of the present invention. FIG. 10 schematically depicts a top view of a method of forming a non-volatile memory according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. The substrate 110 may include a bulk substrate 112 and a dielectric layer 114 on the bulk substrate 112. A back gate 10 is located in the dielectric layer 114. The dielectric layer 114 may be an oxide layer, and the back gate 10 may be a conductive material such as copper, but it is not limited thereto. Methods of forming the dielectric layer 114 and the back gate 10 may include the following steps. A dielectric layer (not shown) may blanketly cover the bulk substrate 112, the dielectric layer is etched to form a recess, and then the back gate 10 fills the recess, but it is not limited thereto. An insulating layer 120 is formed to cover the dielectric layer 114 and the back gate 10. The insulating layer 120 may be an oxide layer, but it is not limited thereto.

Figure 2:
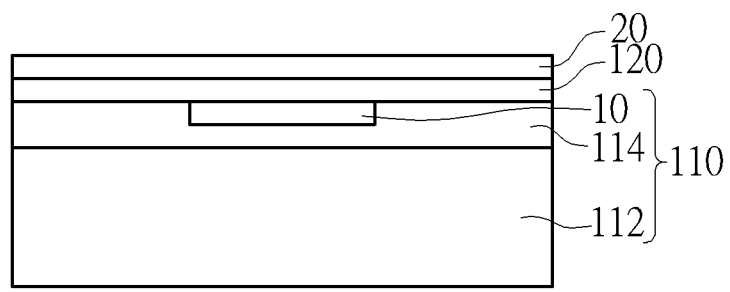
FIG. 2 schematically depicts a cross-sectional view of a method of forming a non-volatile memory according to an embodiment of the present invention.

As shown in FIG. 2, a first graphene ribbon layer 20 is formed on the insulating layer 120. More precisely, a first graphene layer (not shown) may blanketly cover the insulating layer 120, and then the first graphene layer is patterned to form the first graphene ribbon layer 20, as shown in FIG. 10, which depicts a top view of a method of forming a non-volatile memory according to an embodiment of the present invention. Compared to nanotubes used for forming non-volatile memory devices, the first graphene ribbon layer 20 of the present invention is easier to grow on the insulating layer 120 such as an oxide layer, thereby simplifying processes and improving structures, and hence improving processing yields. The first ribbon layer may be formed by importing methane gases as a precursor and inert gases such as hydrogen gases, to grow on the insulating layer 120, but it is not limited thereto.

Figure 3:
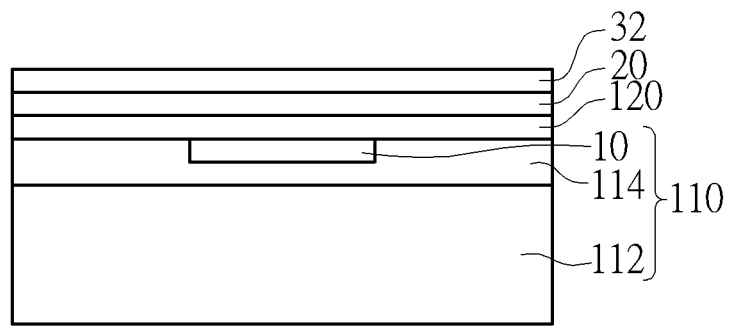
FIG. 3 schematically depicts a cross-sectional view of a method of forming a non-volatile memory according to an embodiment of the present invention.

As shown in FIG. 3, a first dielectric layer 32 is formed on the first graphene ribbon layer 20. In a preferred embodiment, the first dielectric layer 32 is a first ultraviolet light dissociated dielectric layer. In a still preferred embodiment, the first dielectric layer 32 is a first ultraviolet light sensing dielectric layer, which can be dissociated and removed by breaking bonding into small molecules through irradiating ultraviolet light. In one case, the first dielectric layer 32 may be patterned to be trimmed with the first graphene ribbon layer 20 below the first dielectric layer 32. Otherwise, the step of patterning the first graphene layer to form the first graphene ribbon layer 20 may be replaced by the step of patterning the first graphene layer and the first dielectric layer 32 to form the first graphene ribbon layer 20 and the first dielectric layer 32, and thus forming the structure of FIG. 10, but it is not limited thereto.

Figure 4:
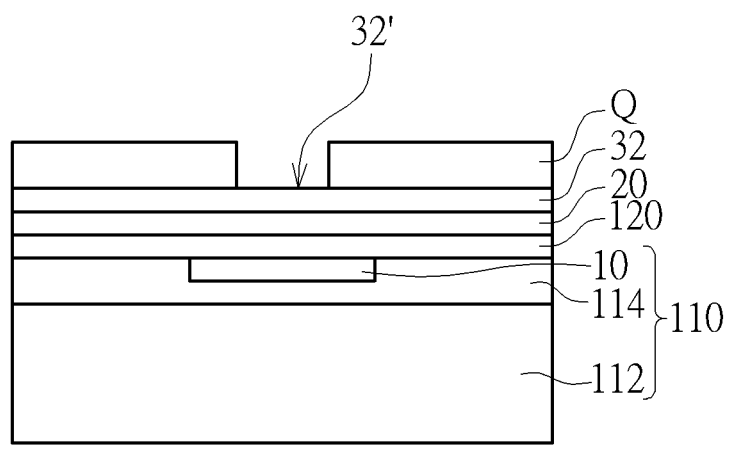
FIG. 4 schematically depicts a cross-sectional view of a method of forming a non-volatile memory according to an embodiment of the present invention.
Figure 5:
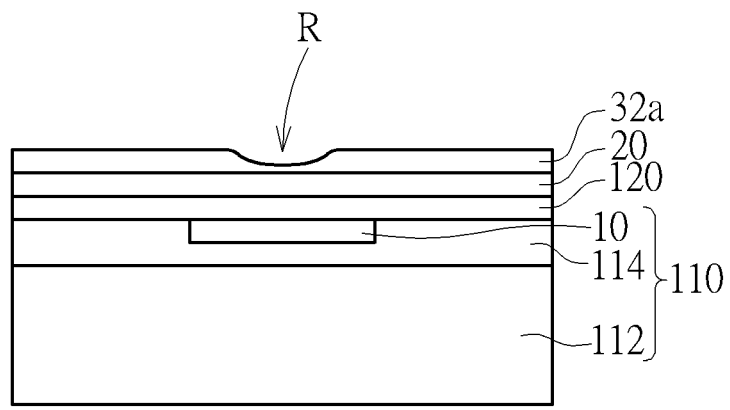
FIG. 5 schematically depicts a cross-sectional view of a method of forming a non-volatile memory according to an embodiment of the present invention.

Please refer to FIGS. 4-5, a recess R is formed in a first dielectric layer 32a. As shown in FIG. 4, a patterned photoresist Q is formed on the first dielectric layer 32, and a part 32' of the first dielectric layer 32 is exposed. As shown in FIG. 5, the part 32' of the first dielectric layer 32 is etched to form the recess R in the first dielectric layer 32a. Then, the patterned photoresist Q is removed. In one case, the part 32' of the first dielectric layer 32 may be removed by a wet etching process, but it is not limited thereto.

Figure 6:
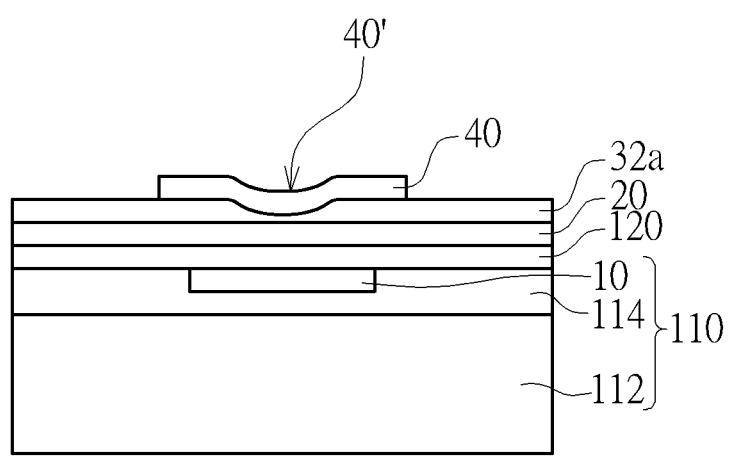
FIG. 6 schematically depicts a cross-sectional view of a method of forming a non-volatile memory according to an embodiment of the present invention.

As shown in FIG. 6, a second graphene ribbon layer 40 is formed on the first dielectric layer 32a. More precisely, a second graphene layer (not shown) blanketly covers the first dielectric layer 32a, and then the second graphene layer is patterned to form the second graphene ribbon layer 40, as shown in FIG. 10. The first dielectric layer 32a having the recess R is formed, and then the second graphene ribbon layer 40 is formed on the first dielectric layer 32a. Since the first dielectric layer 32a has the recess R, a bending part 40' of the second graphene ribbon layer 40 on the recess R can be formed. The first graphene ribbon layer 20, the first dielectric layer 32a and the second graphene ribbon layer 40 of FIG. 10 are just one case of the present invention, but it is not limited thereto.

Figure 7:
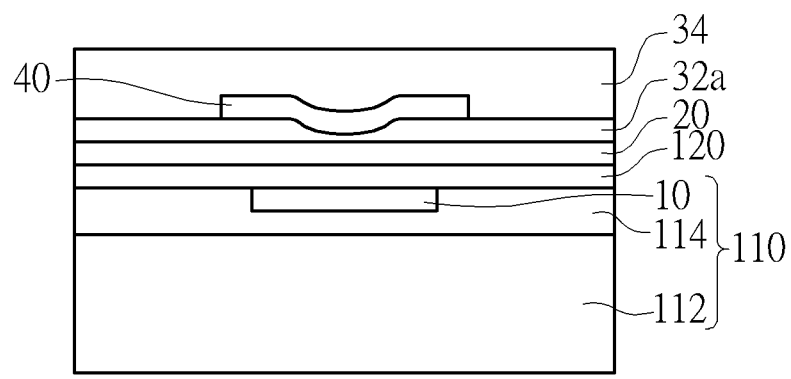
FIG. 7 schematically depicts a cross-sectional view of a method of forming a non-volatile memory according to an embodiment of the present invention.

As shown in FIG. 7, a second dielectric layer 34 is formed on the first dielectric layer 32a and the second graphene ribbon layer 40. In this embodiment, the second dielectric layer 34 blanketly covers the first dielectric layer 32a and the second graphene ribbon layer 40. In a preferred embodiment, the second dielectric layer 34 is a second ultraviolet light dissociated dielectric layer. In a still preferred embodiment, the second dielectric layer 34 is a second ultraviolet light sensing dielectric layer, which can be dissociated and removed by breaking bonding into small molecules through irradiating ultraviolet light.

As shown in FIG. 8, a porous dielectric layer 50 is formed on the second dielectric layer 34, for removing gases dissociated from the first dielectric layer 32a and the second dielectric layer 34. In a preferred embodiment, the porous dielectric layer 50 may be an ultra-low dielectric constant dielectric layer, but it is not limited thereto. A hard mask layer 60 covers the porous dielectric layer 50 but exposes a part 50' of the porous dielectric layer 50. In this embodiment, the hard mask layer 60 is an opaque hard mask layer, so that the first dielectric layer 32a and the second dielectric layer 34 right below the part 50' of the porous dielectric layer 50 can be removed by an ultraviolet light irradiating process. Preferably, the hard mask layer 60 is a metal hard mask layer, but it is not limited thereto. A treatment process P is performed to remove a part 34' of the second dielectric layer 34 and a part 32a' of the first dielectric layer 32a right below the part 50' of the porous dielectric layer 50, thereby a cantilever part 40a being formed from the second graphene ribbon layer 40 right below the part 50' of the porous dielectric layer 50, and a first dielectric layer 32b and a second dielectric layer 34a being formed, as shown in FIG. 9. The cantilever part 40a includes a bending part 40', and the bending part 40' is closer to the first graphene ribbon layer 20 than two end parts 40b of the second graphene ribbon layer 40. In this way, logic "0" or logic "1" can be obtained by applying a voltage to change the bending curvature of the cantilever part 40a. The porous dielectric layer 50 seals the cantilever part 40a without contacting the cantilever part 40a, but it is not limited thereto. Thus, the first graphene ribbon layer 20 and the second graphene ribbon layer 40 can be avoided to be exposed to the air. The treatment process P may be an ultraviolet light irradiating process, but it is not limited thereto.

After the treatment process P is performed, first contact plugs C1 connecting two end parts 40b of the second graphene ribbon layer 40, and second contact plugs C2 connecting two end parts 20a of the first graphene ribbon layer 20 are formed. The first contact plugs C1 and the second contact plugs C2 may be made of metals such as copper or aluminum etc, but it is not limited thereto. Therefore, a non-volatile memory 100 is formed.

Above all, the non-volatile memory 100 may include: the back gate 10 disposed in a substrate 10; the first graphene ribbon layer 20 disposed on the substrate 10; the dielectric layer 30 covers the first graphene ribbon layer 20 but exposes a part 20' of the first graphene ribbon layer 20; the second graphene ribbon layer 40 disposed above the first graphene ribbon layer 20, wherein the second graphene ribbon layer 40 includes the cantilever part 40a connecting the two end parts 40b, and the cantilever part 40a is located right above the exposed part 20' of the first graphene ribbon layer 20; the porous dielectric layer 50 disposed on a dielectric layer 30 and seals the cantilever part 40a without contacting the cantilever part 40a. The dielectric layer 30 includes the first dielectric layer 32b and the second dielectric layer 34a stacked from bottom to top, and the two end parts 40b of the second graphene ribbon layer 40 are respectively sandwiched by the first dielectric layer 32b and the second dielectric layer 34a. In this case, the back gate 10 may be a word line, the first contact plugs C1 electrically connect bit lines, and the second contact plugs C2 electrically connect release lines.

To summarize, the present invention provides a non-volatile memory and forming method thereof, which includes a first graphene ribbon layer disposed on a substrate; a dielectric layer covers the first graphene ribbon layer but exposes a part of the first graphene ribbon layer; a second graphene ribbon layer disposed above the first graphene ribbon layer, wherein the second graphene ribbon layer includes a cantilever part connecting two end parts, and the cantilever part is located right above the exposed part of the first graphene ribbon layer. In this way, logic "0" or logic "1" can be obtained by applying a voltage to change the bending curvature of the cantilever part. Compared to nanotubes used for forming non-volatile memory devices, the first graphene ribbon layer of the present invention is easier to grow on an insulating layer such as an oxide layer, thereby simplifying processes and improving structures, and hence improving processing yields. The porous dielectric layer is disposed on the dielectric layer, and seals the cantilever part without contacting the cantilever part, thus the first graphene ribbon layer and the second graphene ribbon layer can being avoided to be exposed to the air.

The present invention also provides a method of forming a non-volatile memory, which forms a first graphene ribbon layer, a first dielectric layer, a second graphene ribbon layer, a second dielectric layer and a porous dielectric layer sequentially on a substrate; forms a hard mask layer covering the porous dielectric layer but exposing a part of the porous dielectric layer; performs a treatment process to remove a part of the second dielectric layer and a part of the first dielectric layer right below the exposed part of the porous dielectric layer, thereby forming a cantilever part of the second graphene ribbon layer formed from the part of the second graphene ribbon layer right below the exposed part of the porous dielectric layer. By doing this, the first dielectric layer and the second dielectric layer can be partially removed and the cantilever part of the second graphene ribbon layer can be formed by performing the treatment process. This simplifies processes, and no electrostatic stiction occurs caused by charge accumulation, thus data error caused by electrostatic stiction occurring while reading or writing can being avoided. Smaller gaps between the graphene ribbon layers and low deformations of the graphene ribbon layers lead to the non-volatile memory having high reading/writing speed.

Preferably, the first dielectric layer and the second dielectric layer may be ultraviolet light dissociated dielectric layers. Still preferably, the first dielectric layer and the second dielectric layer may be ultraviolet light sensing dielectric layers. The treatment process may be an ultraviolet light irradiating process, therefore parts of the first dielectric layer and the second dielectric layer may be dissociated and removed by irradiating ultraviolet light, but it is not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory, comprising:
   a back gate disposed in a substrate;
   a first graphene ribbon layer disposed on the substrate;
   a dielectric layer covering the first graphene ribbon layer but exposing a part of the first graphene ribbon layer;
   a second graphene ribbon layer disposed above the first graphene ribbon layer, wherein the second graphene ribbon layer comprises a cantilever part connecting two end parts, and the cantilever part is located right above the exposed part of the first graphene ribbon layer; and
   a porous dielectric layer disposed on the dielectric layer and sealing the cantilever part.

2. The non-volatile memory according to claim 1, wherein the dielectric layer comprises an ultraviolet light dissociated dielectric layer, wherein the ultraviolet light dissociated dielectric layer comprises a first ultraviolet light dissociated dielectric layer and a second ultraviolet light dissociated dielectric layer stacked from bottom to top, and the two end parts are respectively sandwiched by the first ultraviolet light dissociated dielectric layer and the second ultraviolet light dissociated dielectric layer.

3. The non-volatile memory according to claim 2, wherein the ultraviolet light dissociated dielectric layer comprises an ultraviolet light sensing dielectric layer.

4. The non-volatile memory according to claim 1, wherein the porous dielectric layer seals the cantilever part without contacting the cantilever part.

5. The non-volatile memory according to claim 1, wherein the porous dielectric layer comprises an ultra-low dielectric constant dielectric layer.

6. The non-volatile memory according to claim 1, further comprising:
   first contact plugs connecting the two end parts of the second graphene ribbon layer, and second contact plugs connecting two end parts of the first graphene ribbon layer.

7. The non-volatile memory according to claim 6, wherein the back gate comprises a word line, the first contact plugs electrically connect bit lines, and the second contact plugs electrically connect release lines.

8. The non-volatile memory according to claim 1, wherein the cantilever part comprises a bending part, wherein the bending part is closer to the first graphene ribbon layer than the two end parts.

9. A method of forming a non-volatile memory, comprising:
sequentially forming a first graphene ribbon layer, a first dielectric layer, a second graphene ribbon layer, a second dielectric layer and a porous dielectric layer on a substrate;
forming a hard mask layer covering the porous dielectric layer but exposing a part of the porous dielectric layer; and
performing a treatment process to remove a part of the second dielectric layer and a part of the first dielectric layer right below the exposed part of the porous dielectric layer, thereby a cantilever part of the second graphene ribbon layer formed from the part of the second graphene ribbon layer right below the exposed part of the porous dielectric layer being formed.

10. The method of forming a non-volatile memory according to claim 9, wherein the porous dielectric layer seals the cantilever part without contacting the cantilever part.

11. The method of forming a non-volatile memory according to claim 9, wherein the porous dielectric layer comprises an ultra-low dielectric constant dielectric layer, and the first dielectric layer comprises a first ultraviolet light dissociated dielectric layer while the second dielectric layer comprises a second ultraviolet light dissociated dielectric layer.

12. The method of forming a non-volatile memory according to claim 11, wherein the first ultraviolet light dissociated dielectric layer comprises a first ultraviolet light sensing dielectric layer, and the second ultraviolet light dissociated dielectric layer comprises a second ultraviolet light sensing dielectric layer.

13. The method of forming a non-volatile memory according to claim 9, wherein the treatment process comprises an ultraviolet light irradiating process.

14. The method of forming a non-volatile memory according to claim 9, wherein the hard mask layer comprises an opaque hard mask layer.

15. The method of forming a non-volatile memory according to claim 14, wherein the hard mask layer comprises a metal hard mask layer.

16. The method of forming a non-volatile memory according to claim 9, wherein the steps of forming the first graphene ribbon layer comprise:
blanketly covering a first graphene layer on the substrate; and
patterning the first graphene layer to form the first graphene ribbon layer.

17. The method of forming a non-volatile memory according to claim 9, wherein the cantilever part comprises a bending part, wherein the bending part is closer to the first graphene ribbon layer than two end parts of the second graphene ribbon layer.

18. The method of forming a non-volatile memory according to claim 17, further comprising:
etching a part of the first dielectric layer to form a recess in the first dielectric layer after the first dielectric layer is formed, and the bending part of the second graphene ribbon layer is formed on the recess while the second graphene ribbon layer is formed.

19. The method of forming a non-volatile memory according to claim 9, wherein the steps of forming the second graphene ribbon layer comprise:
blanketly covering a second graphene layer on the first dielectric layer; and
patterning the second graphene layer to form the second graphene ribbon layer.

20. The method of forming a non-volatile memory according to claim 9, further comprising:
removing the hard mask layer after the treatment process is performed; and
forming first contact plugs connecting two end parts of the second graphene ribbon layer, and second contact plugs connecting two end parts of the first graphene ribbon layer.

* * * * *